US008030944B2

(12) United States Patent
Ni

(10) Patent No.: US 8,030,944 B2
(45) Date of Patent: Oct. 4, 2011

(54) METHOD FOR CONTINUITY TEST OF INTEGRATED CIRCUIT

(75) Inventor: Cheng-Chin Ni, Taipei (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 99 days.

(21) Appl. No.: 12/143,557

(22) Filed: Jun. 20, 2008

(65) Prior Publication Data

US 2009/0251165 A1  Oct. 8, 2009

(30) Foreign Application Priority Data

Apr. 7, 2008  (TW) ................................ 97112529 A

(51) Int. Cl.
*G01R 31/02* (2006.01)
*G01R 31/28* (2006.01)

(52) U.S. Cl. ...................................................... 324/537

(58) Field of Classification Search .................. None
See application file for complete search history.

(56) References Cited

U.S. PATENT DOCUMENTS

| | | | | |
|---|---|---|---|---|
| 3,423,606 A * | 1/1969 | Wanlass | .................. | 257/551 |
| 4,894,605 A * | 1/1990 | Ringleb et al. | ................ | 324/537 |
| 5,072,175 A * | 12/1991 | Marek | .......................... | 324/73.1 |
| 5,428,294 A * | 6/1995 | Teel, Jr. | ......................... | 324/418 |
| 5,521,513 A * | 5/1996 | Stringer | ........................ | 324/537 |
| 5,554,928 A * | 9/1996 | Stringer | .................... | 324/763.01 |
| 5,786,700 A * | 7/1998 | Jen et al. | ........................ | 324/713 |
| 6,932,624 B1 * | 8/2005 | Hoopes et al. | ............... | 439/76.1 |
| 2010/0301892 A1 * | 12/2010 | Shimomura et al. | ...... | 324/762.01 |

FOREIGN PATENT DOCUMENTS

| | | | |
|---|---|---|---|
| JP | 07244107 A | * | 9/1995 |
| JP | 2008102101 A | * | 5/2008 |

* cited by examiner

*Primary Examiner* — Paresh Patel

(74) *Attorney, Agent, or Firm* — Stout, Uxa, Buyan & Mullins, LLP

(57) ABSTRACT

The present invention provides a method for continuity test of integrated circuit. By using both pins of integrated circuit to measure a current of an electrostatic discharge device, the contact resistance of the integrated circuit can be obtained by calculating. The method comprises the steps: First, a DUT (device under test) is provided, and the DUT includes a second pin and the second pin connecting zero reference potential. Then, a voltage is applied to a first pin of DUT. Finally, the current through said first pin and said second pin would be measured. Therefore, the testing result of the DUT could be more precise and the quality of the DUT would be made sure.

13 Claims, 7 Drawing Sheets

METHOD FOR CONTINUITY TEST OF INTEGRATED CIRCUIT

BACKGROUND OF THE INVENTION (1) Field of the Invention

The present invention relates to a method for continuity test of integrated circuit. More particularly, the present invention relates to a method for continuity test of integrated circuit by utilizing current flow.

(2) Prior Art

Integrated circuit (IC) is a device which is formed a complete and logical circuit by integrating several electronic devices, such as transistor, electrostatic discharge device (ESD), and capacitor etc., on a silicon chip. Integrated circuits could have several abilities of function, such as control, calculate, and memory etc., for applying varies of electronic products. Fabrication process of integrated circuit includes design, pulling, slicing, polishing, oxidation, diffusion, deposition, mask, etching, detection, die saw, die bonding, wire bonding, package, test process etc. In these processes, the test process is to test several characteristics of integrated circuit, such as electricity of the integrated circuit, for making sure quality of the integrated circuit. Thus, it's why the test process is a very important process in the fabrication process of integrated circuit.

FIG. 1 shows a traditional method for testing open circuit of integrated circuit. The method includes a direct circuit (DC) flowed to a device under test (DUT) 101 for measuring voltage of the DUT and judging quality of continuity of the DUT 101. As shown in FIG. 1, a current is inputted to the DUT 101 by a first pin 102 of the DUT 101, and is outputted from a second pin 103 of the DUT 101. After the test process, the differential voltage between the first pin 102 and the second pin 103 are measured. Test results of the test process are judged by the differential voltage. When the differential voltage is a value between 0.3 volts to 1.5 volts, the test result of the DUT is acceptable and shown pass for reference. Otherwise, outside the mentioned-above ranges, the test result of the DUT is unacceptable and shown fail for reference.

As shown in FIG. 1, the differential voltage between the first pin 102 and the second pin 103 is the same as a differential voltage through an ESD device 104. When applying a current, 100 μA, to the ESD device 104 which has a contact resistance 105 is 900Ω, the tested voltage, only adding 0.09 volts, is obtained. Then, the adding value of tested voltage of the DUT tested by mentioned-above method would be judged pass for reference. However, a DUT having a 900Ω contact resistance would make the DUT be judged being abnormal when functional test of the DUT is performed.

Therefore, in the conventional method for testing open circuit of integrated circuit, the contact resistance 105 of the DUT couldn't be measured. Then, the whole quality of the DUT would be affected by judging error. Thus, a method for integrated circuit test is needed to solve the problem which the contact resistance of the DUT couldn't be measured by the traditional method for testing open circuit of integrated circuit. Moreover, the improving method is needed to measure a contact resistance of the DUT accurately for making sure the quality of the DUT.

SUMMARY OF THE INVENTION

An object of the present invention is to solve the problem that a contact resistance of a DUT couldn't be measured by the conventional method and to solve the problem that the contact resistance of the DUT couldn't be measured accurately.

To achieve the object mentioned above, the present invention provides a method for testing integrated circuit (IC), which comprises a current of an ESD device of the IC is measured by using two pins of the IC for obtaining a contact resistance of the IC. The method of the present invention comprises following steps: First, a DUT is provided, and the DUT includes a second pin connecting to a zero reference potential. Then, a voltage is applied to a first pin of the DUT. Finally, a current through the first pin and the second pin could be measured. Furthermore, a contact resistance of the DUT could be calculated by the voltage and the current. Therefore, the testing result of the DUT could be more precise and the quality of the DUT would be made sure.

Thus, the method of the present invention for continuity test of IC could solve the problem that resistance of IC can't be measured by conventional technology. Moreover, the method of the present invention improves the problem that contact resistance of IC can't be measured accurately and quality of the DUT would be made sure.

In the following description of the preferred embodiment, reference is made to the accompanying drawings which form a part hereof, and in which is shown by way of illustration specific embodiments in which the invention may be practiced.

DETAILED DESCRIPTION OF THE INVENTION

Figure 1:
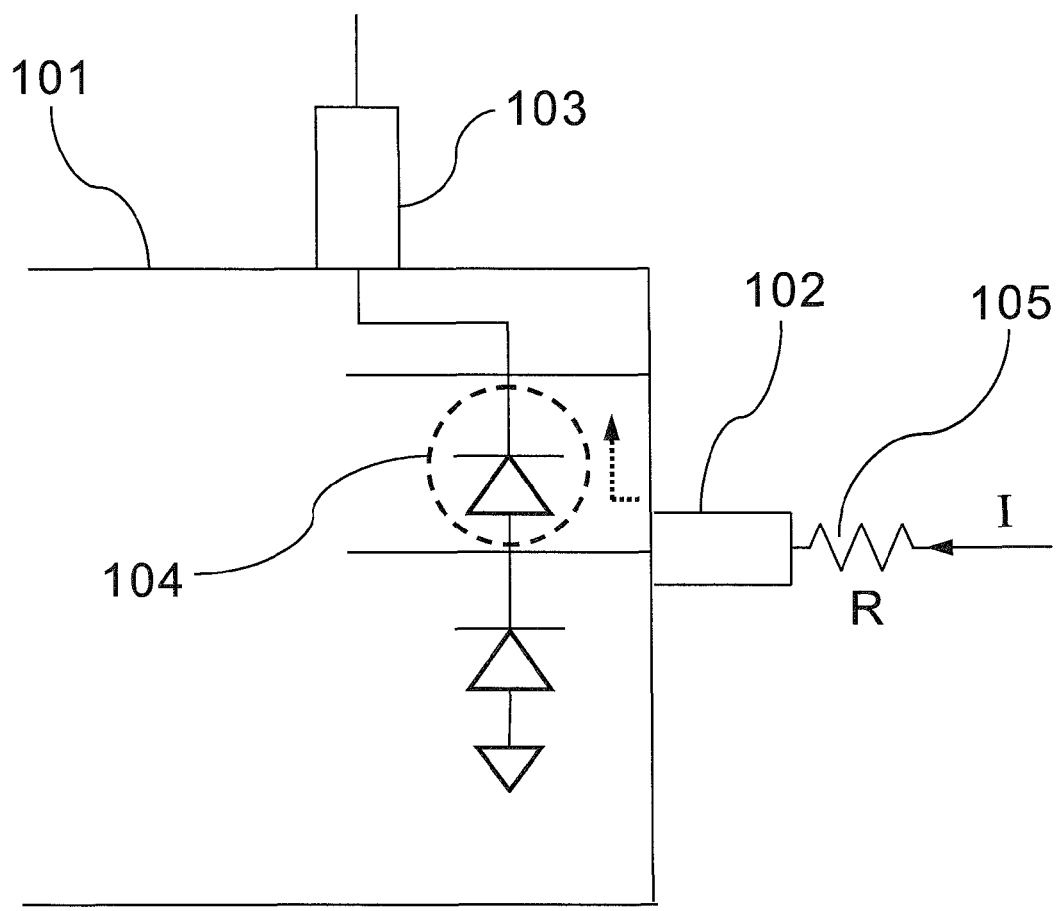
FIG. 1 shows a diagram of a conventional method for testing IC.
Figure 2:
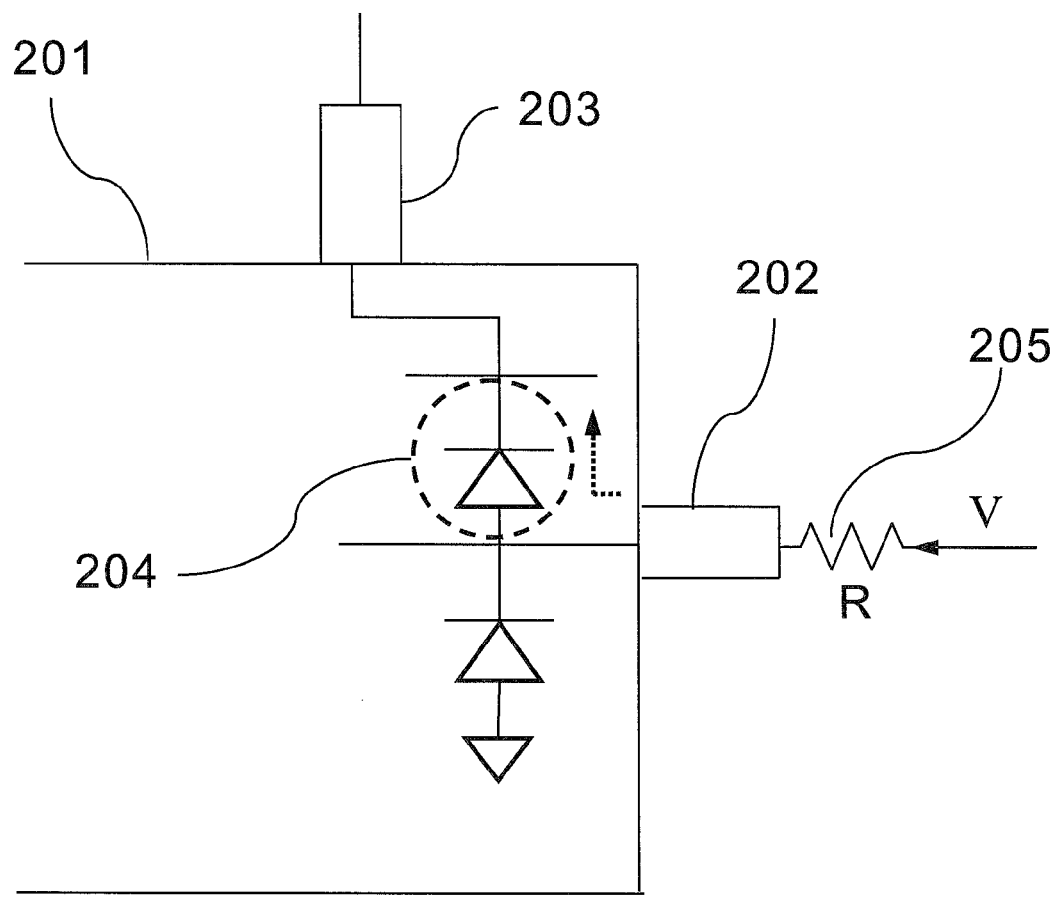
FIG. 2 shows a diagram of a method of the present invention for testing IC.
Figure 3:
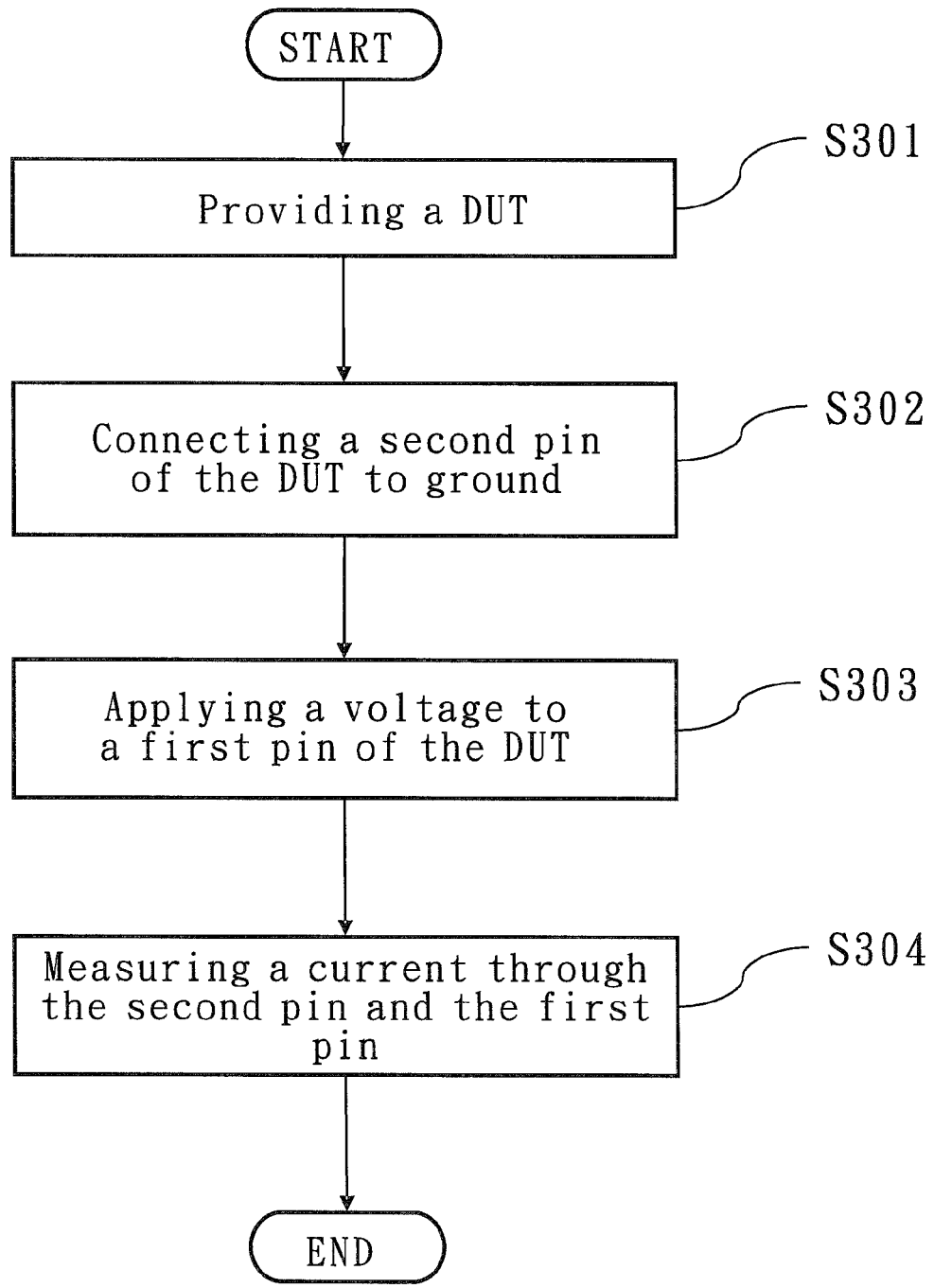
FIG. 3 shows a flowchart of the method of the present invention for testing IC.

FIG. 2 shows a diagram of a method of the present invention for testing integrated circuit (IC). In FIG. 2, a device under test (DUT) 201 has a first pin 202, a second pin 203 and an electrostatic discharge device (ESD) 204. FIG. 3 shows a flowchart of the method of the present invention for testing IC, and accompanies with FIG. 2 to describe the method of the present invention as below:

In step S301, it shows providing a DUT 201. The DUT 201 could be one selected from following: such as memory, system on chip (SOC), drive chip of LCD, charge coupled device (CCD), mixed signal IC, or RF IC etc.

In step S302, it shows connecting a second pin 203 of the DUT 201 to ground. The purpose of connecting the second pin 203 to ground is to form a test circuit after applying a voltage to the DUT 301. Then, this step would advantage the following current measurement.

In step S303, it shows applying a voltage to a first pin 202 of the DUT 201. Then, a current would be formed, as shown in FIG. 2. The direction of the current is from the second pin 202 to the first pin 203.

In step S304, it shows measuring a current through the second pin 203 and the first pin 202. After the test circuit is formed, the current between the second pin 203 and the first pin 202 (or the current of the ESD device 204) could be measured by any traditional method. This means that the current of the DUT 201 could be obtained. Then, a contact resistance 205 of the DUT 201 would be calculated by using the current. The calculating method is that replacing the measured current and the applying voltage to the formula for resistance (V=RI), and the contact resistance 205 of the DUT 201 would be obtained by calculating. After the data of the contact resistance 205 are obtained, user could judge the electrical quality of the DUT 201 according to the characteristic and the contact resistance of different types of DUT.

Figure 4:
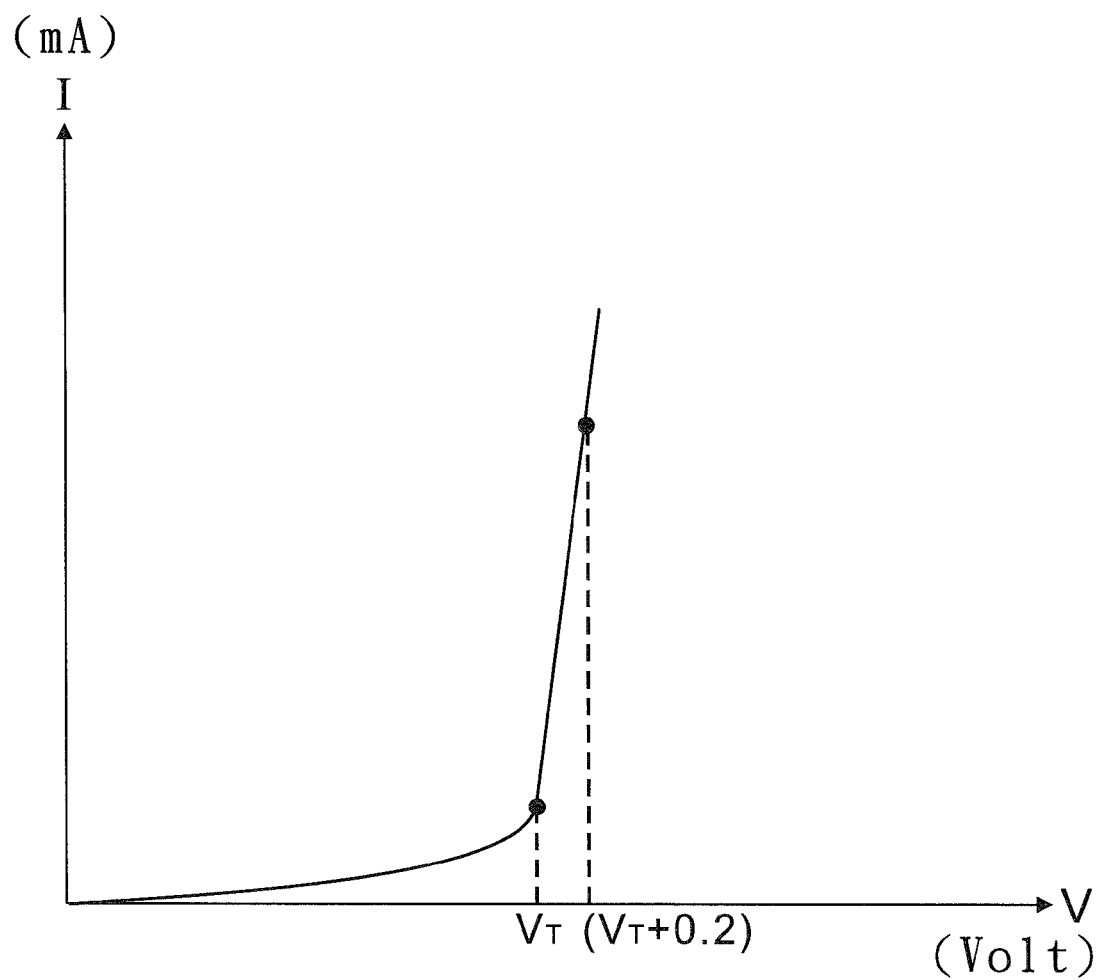
FIG. 4 shows a V-I relationship diagram which is measured by the method of the present invention for testing IC.

FIG. 4 shows a V-I relationship diagram which is measured by the method of the present invention for testing IC. This is good to explain why applying voltage to IC for testing in the method of the present invention by the V-I relationship diagram of the tested IC. As shown in FIG. 2, the structure of the ESD device 204 is the same as a structure of a diode, which is a device having direction. Therefore, the V-I relationship diagram of the measured IC is the same as a V-I relationship diagram which is measured for testing the diode device. Moreover, when a diode device is applied by an anti-direction voltage, it would cause a breakdown current phenomenon if the anti-direction voltage reaching to a threshold voltage. In FIG. 4, which shows the V-I relationship diagram of the IC, and, when the voltage reaches to value of the threshold voltage $V_T$, the corresponding current would be changed sharply with adding value of voltage. This means that the range of current could be milliampere level if applying a voltage more than the threshold voltage to the IC. Then, the current would be measured more easily. Therefore, in an embodiment of the present invention, when applying a voltage ($V_T$+ about 0.2) volts to the IC, a corresponding current of the IC could be measured accurately. In an implementation of the present invention, an IC having a threshold voltage, about 0.7 volts, is provided. When applying a voltage, about 0.9 volts, to the IC, a corresponding current of the IC could be measured accurately.

Figure 5:
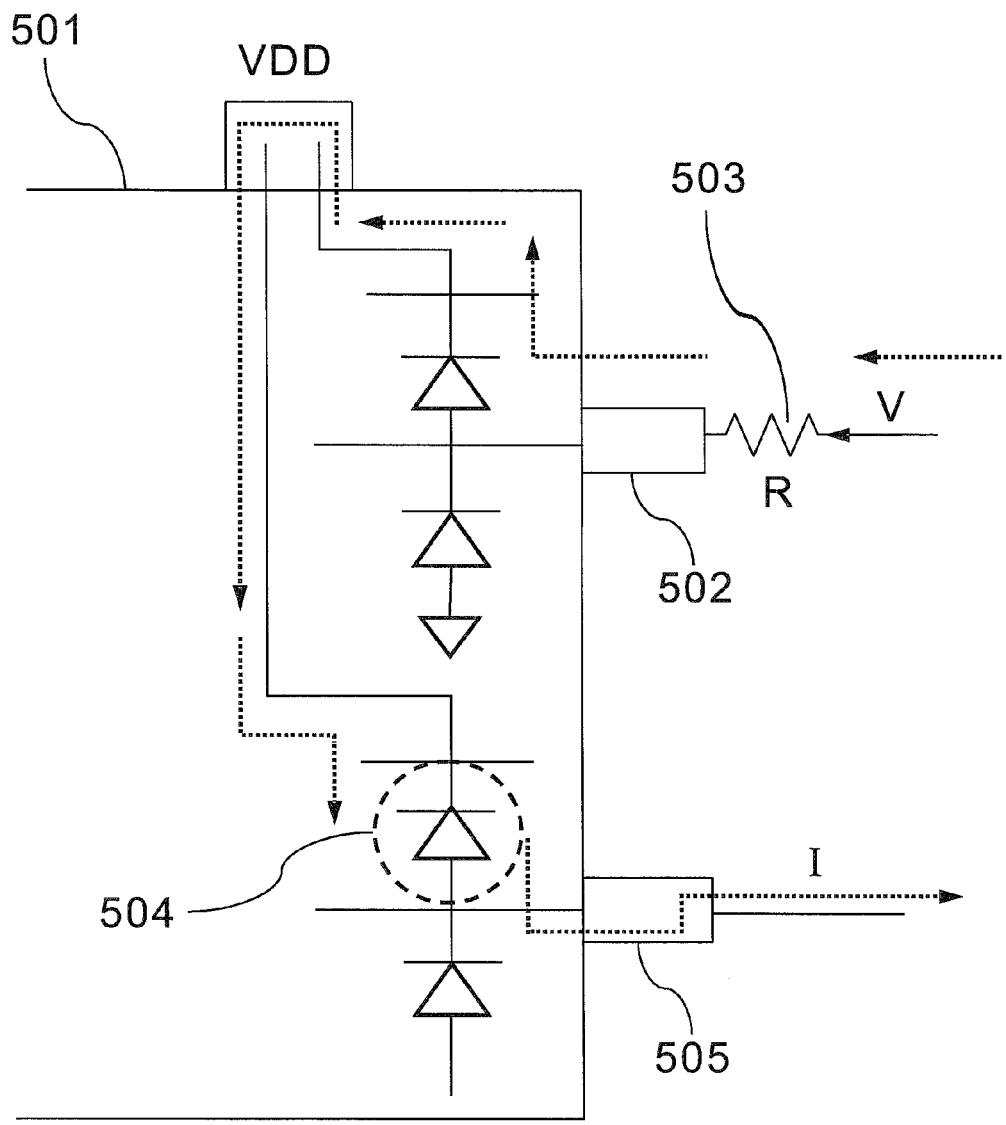
FIG. 5 shows an advanced method of the present invention for testing IC.
Figure 6:
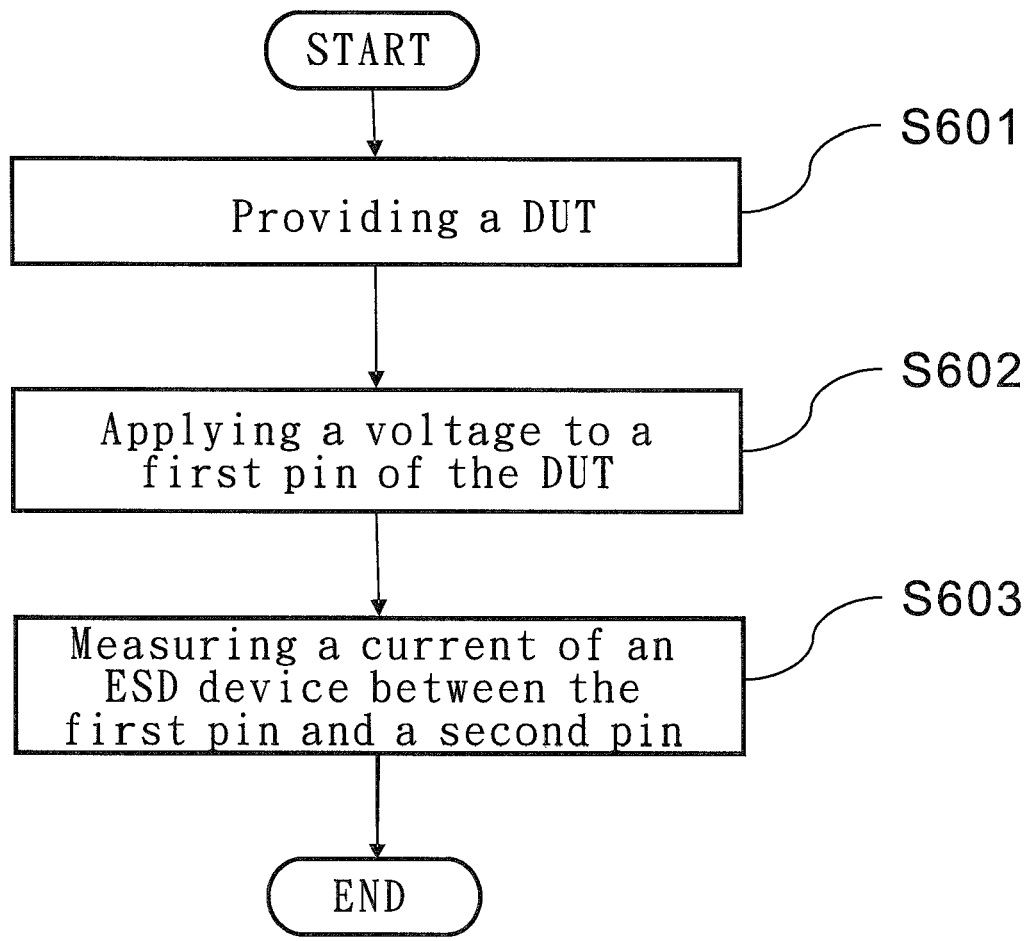
FIG. 6 shows a flowchart of the advanced method of the present invention for testing IC.

FIG. 5 shows an advanced method of the present invention for testing IC. A voltage V is applied to a first pin 502 of a DUT 501, and a current of the ESD device 504 could be measured from a second pin 505 due to the direction of the EDS device 504 and the direction of the current are anti-direction. FIG. 6 shows a flowchart of the advanced method of the present invention for testing IC, and accompanies with FIG. 5 to describe the advanced method of the present invention as below:

In step S601, it shows providing a DUT 501. In step S602, it shows applying a voltage to a first pin 502 of the DUT 501. The operations and principles of these two steps are the same as the steps shown in S301 and S303, and do not repeat herein. In this embodiment, the DUT 501 doesn't connect to ground, but the second pin 505 connects to a zero reference potential to flow the current for forming a test circuit.

In step S603, it shows measuring a current of an ESD device between the first pin 502 and the second pin 505. In this embodiment, when applying a voltage ($V_T$+ about 0.2) volts to the IC, a corresponding current of the IC, which is milliampere level, could be measured accurately. The calculations after obtaining the current are the same as the step S304, and do not repeat herein.

Figure 7:
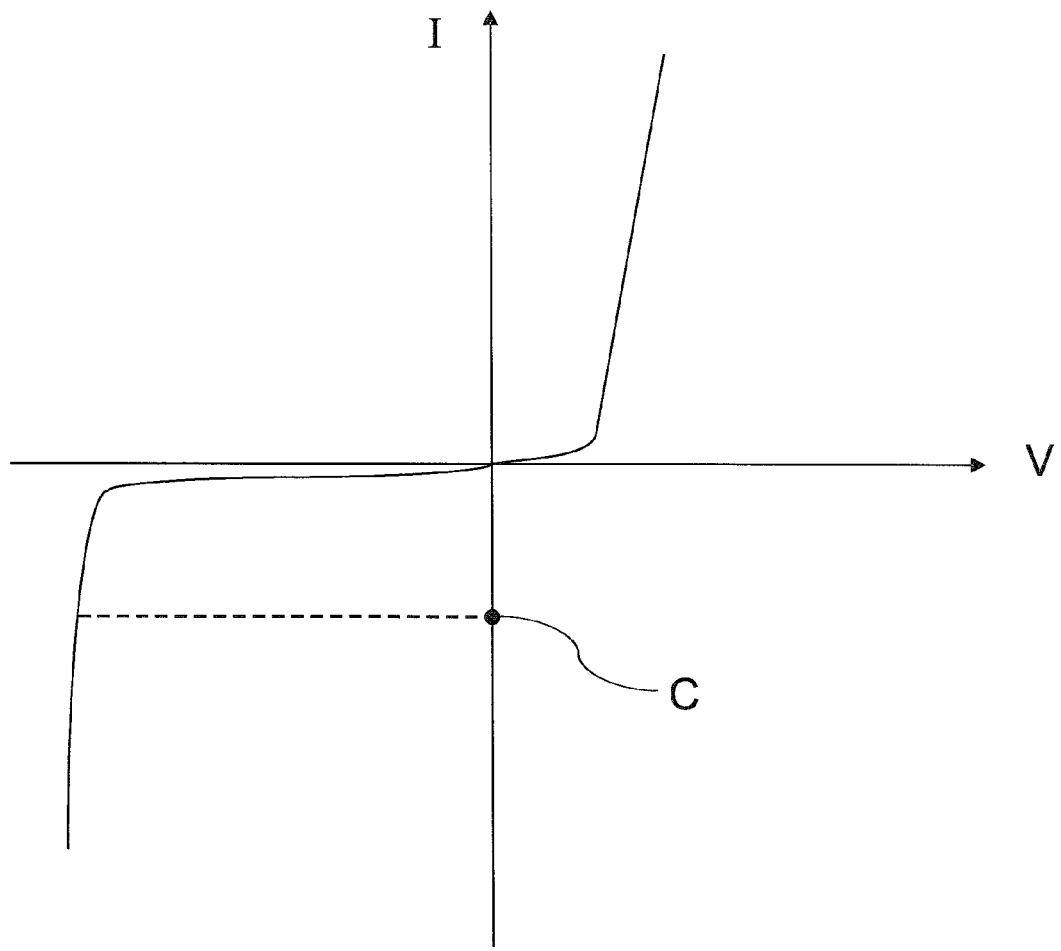
FIG. 7 shows a V-I relationship diagram of breakdown current of an IC.

FIG. 7 shows a V-I relationship diagram of breakdown current of an IC. According to the ESD device 504 in FIG. 5, the direction of the ESD device 504 is different with the direction of the current. When a voltage apparatus is applied to the ESD device 504, expression of the current would be the same as the left part of the V-I relationship diagram in FIG. 7. At first, a small anti-current is maintained. With the voltage reaching to the threshold voltage, the current would be raising immediately and sharply, and become a breakdown current. Then, the measured current of the present invention is the current after breakdown, such as the point C shown in FIG. 7. Moreover, the value range of current of this point C is milliampere (mA) level.

An advantage of the present invention is to solve the problem that the contact resistance of the IC is difficult to measure. This problem could be solved by the present invention by applying a voltage apparatus for providing voltage and accompanying with the characteristics of V-I relationship. Moreover, the method of the present invention for testing IC (as shown in FIG. 3) and the advanced method of the present invention for testing IC (as shown in FIG. 6) could be established two one-variable linear V-I relationship equations, respectively. Then, the qualities and electricity of IC could be judged by these two one-variable linear V-I relationship equations.

The specific arrangements and methods herein are merely illustrative of the principles of this invention. Numerous modifications in form and detail may be made by those skilled in the art without departing from the true spirit and scope of the invention.

What is claimed is:

1. A method for improving the sensitivity and accuracy of continuity testing an integrated circuit, comprising:
   providing a device under test, which comprises an electrostatic discharge device;
   connecting a second pin of said device under test to a zero reference potential;
   providing a voltage to a first pin of said device under test to reversely bias said electrostatic discharge device to result in a breakdown current, wherein said voltage is more than the threshold voltage of said electrostatic discharge device; and
   measuring said breakdown current of said electrostatic discharge device between the first pin and the second pin; whereby a test circuit with improved sensitivity and accuracy is formed after applying said voltage to said device under test.

2. The method of claim 1, wherein the value of said voltage is determined by the threshold voltage of said electrostatic discharge device plus about 0.2 volts.

3. The method of claim 2, wherein the threshold voltage of said electrostatic discharge device is about 0.7 volts.

4. The method of claim 1, wherein said device under test comprises memory, system on chip, driver chip of LCD, charge coupled device, mixed signal IC, or RF IC.

5. The method of claim 1, further comprising to use the value of said voltage divided by said breakdown current to obtain a contact resistance of said device under test.

6. The method of claim 1, wherein said breakdown current is milliampere (mA) level.

7. A method for improving the sensitivity and accuracy of measurement of contact resistance of an integrated circuit, comprising:
   providing a device under test, which comprises an electrostatic discharge device;
   connecting a second pin of said device under test to a zero reference potential;
   providing a voltage to a first pin of said device under test to reversely bias said electrostatic discharge device to result in a breakdown current, wherein said voltage is more than the threshold voltage of said electrostatic discharge device;

measuring said breakdown current of said electrostatic discharge device between the first pin and the second pin; and utilizing said current and said voltage to obtain a contact resistance of said device under test.

8. The measuring method of claim 7, wherein said voltage is determined by the threshold voltage of said electrostatic discharge device plus about 0.2 volts.

9. The measuring method of claim 8, wherein the threshold voltage of said device under test is about 0.7 volts.

10. The measuring method of claim 7, wherein a test circuit is formed after applying said voltage to said device under test.

11. The measuring method of claim 7, wherein said device under test comprises memory, system on chip, driver chip of LCD, charge coupled device, mixed signal IC, or RF IC.

12. The measuring method of claim 7, wherein said voltage dividing by said breakdown current equals said contact resistance.

13. The measuring method of claim 7, wherein said breakdown current is milliampere (mA) level.

* * * * *